United States Patent
Yu et al.

(10) Patent No.: US 12,288,920 B2
(45) Date of Patent: Apr. 29, 2025

(54) POWER DIVIDER AND ELECTRONIC DEVICE

(71) Applicant: Huawei Technologies Co., Ltd., Shenzhen (CN)

(72) Inventors: Min Yu, Chengdu (CN); Xin Luo, Chengdu (CN); Yi Chen, Leuven (BE)

(73) Assignee: Huawei Technologies Co., Ltd., Shenzhen (CN)

( * ) Notice: Subject to any disclaimer, the term of this patent is extended or adjusted under 35 U.S.C. 154(b) by 191 days.

(21) Appl. No.: 17/988,566

(22) Filed: Nov. 16, 2022

(65) Prior Publication Data
US 2023/0155271 A1    May 18, 2023

(30) Foreign Application Priority Data

Nov. 18, 2021  (CN) .......................... 202111371820.8
Feb. 21, 2022  (CN) .......................... 202210158323.8

(51) Int. Cl.
*H01P 5/16*  (2006.01)
*H01P 3/08*  (2006.01)

(52) U.S. Cl.
CPC . *H01P 5/16* (2013.01); *H01P 3/08* (2013.01)

(58) Field of Classification Search
CPC ...... H01P 5/16; H01P 3/08; H01P 1/18; H01P 5/12; H01Q 3/28; H01Q 3/34; H03H 7/48
See application file for complete search history.

(56) References Cited

U.S. PATENT DOCUMENTS

| | | | | | |
|---|---|---|---|---|---|
| 6,005,442 | A | * | 12/1999 | Maeda | H03F 3/604 333/127 |
| 7,164,903 | B1 | * | 1/2007 | Cliff | H01P 5/185 333/116 |
| 7,973,617 | B2 | * | 7/2011 | Yurugi | H01Q 21/22 333/136 |
| 9,178,263 | B1 | * | 11/2015 | Podell | H01P 3/08 |

(Continued)

OTHER PUBLICATIONS

Chen, A., et al., "A Horst-Type Power Divider With Wide Frequency Tuning Range Using Varactors," IEEE Access, vol. 7, Dec. 21, 2018, 8 pages.

(Continued)

*Primary Examiner* — John W Poos
(74) *Attorney, Agent, or Firm* — Slater Matsil, LLP

(57) ABSTRACT

A power divider and an electronic device are provided. The power divider includes: a main port having an input characteristic admittance; a first output port having a first characteristic admittance; a second output port having a second characteristic admittance, where the second and the first characteristic admittances have a predetermined ratio relationship; a first adjustment branch coupled between the main port and the first output port; and a second adjustment branch coupled between the main port and the second output port. The input characteristic admittance is a sum of admittances presented by the first and second adjustment branches at the main port. The admittance presented by the first adjustment branch at the main port and the admittance presented by the second adjustment branch at the main port are adjustable and the input characteristic admittance is enabled to be equal to a sum of the first and the second characteristic admittances.

20 Claims, 6 Drawing Sheets

(56) References Cited

U.S. PATENT DOCUMENTS

2014/0132364 A1* 5/2014 Ehyaie ............... H01P 5/16
                                                     333/125
2018/0034153 A1* 2/2018 Kaneko ............... H04B 1/00

OTHER PUBLICATIONS

Li, W. et al., "A T-junction power divider with tunable operating frequency and dividing ratio," Microwave and Optical Technology Letters, vol. 62, No. 6, Jun. 1, 2020, 7 pages.
Qin, P. et al., "A Beam Switching Quasi-Yagi Dipole Antenna," IEEE Transactions on Antennas and Propagation, vol. 61, No. 10, Oct. 2013, 9 pages.
Su, Z. et al., "Additively Manufactured Frequency/Radiation Pattern Reconfigurable Antenna Based on Monolithically Printed VO2 Switch," 13th European Conference on Antennas and Propagation (EuCAP 2019), Jun. 20, 2019, 4 pages.
Wang, Z. et al., "Compact Shared Aperture Quasi-Yagi Antenna With Pattern Diversity for 5G-NR Applications," IEEE Transactions on Antennas and Propagation, vol. 69, No. 7, Jul. 2021, 6 pages.
Zhang, H. et al., "Frequency Reconfigurable Unequal Power Divider with Continuously Broad Tuning Bandwidth," Dec. 6, 2015, 3 pages.

* cited by examiner

Amplitude of output current

Phase of output current

US 12,288,920 B2

POWER DIVIDER AND ELECTRONIC DEVICE

CROSS-REFERENCE TO RELATED APPLICATION

This application claims priority to Chinese Patent Application No. 202111371820.8, filed on Nov. 18, 2021, and Chinese Patent Application No. 202210158323.8, filed on Feb. 21, 2022. The afore-mentioned patent applications are hereby incorporated by reference in their entireties.

TECHNICAL FIELD

This application mainly pertains to the field of power dividers. More specifically, this application relates to a power divider and an electronic device including the power divider.

BACKGROUND

A power divider is a device that divides one path of input signal energy into two or more paths of equal or unequal output energy; or a power divider may combine a plurality of paths of signal energy into one path of output, and in this case, the power divider may also be referred to as a combiner. Isolation between output ports of a power divider needs to be ensured. Power dividers are usually classified into one-to-two power dividers (one input and two outputs) and one-to-three power dividers (one input and three outputs) based on outputs. Main technical parameters of the power divider include power loss (including insertion loss, distribution loss, and reflection loss), a voltage standing wave ratio of each port, isolation, amplitude balance, and phase balance between power distribution ports, a power capacity, and a frequency bandwidth.

Power dividers are widely applied to microwave and millimeter-wave circuits. In a feed network of an array antenna, a power divider may divide one path of signal into a plurality of paths of signals. When a power divider is applied to a microwave solid-state amplifier, the power divider may combine a plurality of signals into one output signal with higher power. The power divider is a key microwave component of a solid-state transmitter. Design quality of the power divider directly affects efficiency and an amplitude-frequency characteristic of the solid-state transmitter.

SUMMARY

This application provides a compact power divider that can adjust an amplitude and a phase of an output current, and a related electronic device.

According to a first aspect of this application, a power divider is provided. The power divider includes a main port, a first output port, a second output port, a first adjustment branch, and a second adjustment branch. The main port has an input characteristic admittance. The first output port has a first characteristic admittance. The second output port has a second characteristic admittance, and the second characteristic admittance and the first characteristic admittance have a predetermined ratio relationship. The first adjustment branch is coupled between the main port and the first output port. The second adjustment branch is coupled between the main port and the second output port. The input characteristic admittance is a sum of an admittance presented by the first adjustment branch at the main port and an admittance presented by the second adjustment branch at the main port. The admittance presented by the first adjustment branch at the main port and the admittance presented by the second adjustment branch at the main port are adjustable and the input characteristic admittance is enabled to be equal to a sum of the first characteristic admittance and the second characteristic admittance.

The first adjustment branch and the second adjustment branch are disposed. In this way, this application provides a power divider that implements impedance matching and can adjust an amplitude and a phase of an output current, to implement variable outputs in two modes: a common mode and a differential mode.

In an implementation, the first adjustment branch includes a first odd-even mode circuit and a first adjustable reactor, and the first odd-even mode circuit has a first odd-mode admittance and a first even-mode admittance. The second adjustment branch includes a second odd-even mode circuit and a second adjustable reactor, and the second odd-even mode circuit has a second odd-mode admittance and a second even-mode admittance. An admittance of the first adjustable reactor and an admittance of the second adjustable reactor are adjustable, and a difference between the admittance of the first adjustable reactor and the admittance of the second adjustable reactor is a fixed value.

In an implementation, the first odd-even mode circuit and the first adjustable reactor are coupled in parallel between the main port and the first output port, and the second odd-even mode circuit and the second adjustable reactor are coupled in parallel between the main port and the second output port.

In an implementation, admittances of the first odd-even mode circuit, the second odd-even mode circuit, the first adjustable reactor, and the second adjustable reactor may satisfy the following relationship:

$$\begin{cases} Y_{Even}^A = -iY_1 \\ Y_{Even}^B = iY_2 \\ (Y_{odd}^A - Y_{odd}^B) + (Y_c^A - Y_c^B) = i(Y_1 + Y_2) \\ Y_c^A \in (-\infty i, \infty i) \\ Y_c^B \in (-\infty i, \infty i) \end{cases}$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively the admittance of the first adjustable reactor and the admittance of the second adjustable reactor. In this manner, impedance matching between input and output of the power divider can be implemented. In addition, the admittance of the first adjustable reactor and the admittance of the second adjustable reactor can further be adjustable between positive infinity and negative infinity respectively. In this way, a ratio of amplitudes of currents output by the power divider can be arbitrarily adjustable between 0:1 and 1:1 and/or 1:1 to 1:0, and a difference between phases of the output currents can be arbitrarily adjustable from 0° to 180°.

In an implementation, the power divider includes a main port, a first output port, a second output port, a first adjustment branch, and a second adjustment branch. The main port has an input characteristic admittance. The first output port has a first characteristic admittance. The second output port has a second characteristic admittance, and the second characteristic admittance and the first characteristic admittance have a predetermined ratio relationship. The first adjustment branch is coupled between the main port and the first output port. The second adjustment branch is coupled between the main port and the second output port. The input characteristic admittance is a sum of an admittance presented by the first adjustment branch at the main port and an admittance presented by the second adjustment branch at the main port. The admittance presented by the first adjustment branch at the main port and the admittance presented by the second adjustment branch at the main port are adjustable. The first adjustment branch includes a first odd-even mode circuit and a first adjustable reactor, and the first odd-even mode circuit has a first odd-mode admittance and a first even-mode admittance. The second adjustment branch includes a second odd-even mode circuit and a second adjustable reactor, and the second odd-even mode circuit has a second odd-mode admittance and a second even-mode admittance. Admittances of the first odd-even mode circuit, the second odd-even mode circuit, the first adjustable reactor, and the second adjustable reactor may satisfy the following relationship:

$$\begin{cases} Y_{Even}^A = -iY_1 \\ Y_{Even}^B = iY_2 \\ (Y_{odd}^A - Y_{odd}^B) + (Y_c^A - Y_c^B) = i(Y_1 + Y_2) \\ Y_c^A \in (-\infty i, \infty i) \\ Y_c^B \in (-\infty i, \infty i) \end{cases}$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively the admittance of the first adjustable reactor and the admittance of the second adjustable reactor. In this manner, impedance matching between input and output of the power divider can be implemented. In addition, the admittance of the first adjustable reactor and the admittance of the second adjustable reactor are adjusted, so that a ratio of amplitudes of currents output by the power divider can be arbitrarily adjustable between 0:1 and 1:1 and/or 1:1 to 1:0, and a difference between phases of the output currents can be arbitrarily adjustable from 0° to 180°.

In an implementation, the first odd-even mode circuit and the second odd-even mode circuit each include a pair of microstrips arranged in parallel. Using the microstrip to implement the odd-even mode circuit can further promote miniaturization of the power divider and lower costs of the power divider.

In an implementation, the pair of microstrips of the first odd-even mode circuit is grounded, and/or the pair of microstrips of the second odd-even mode circuit is grounded.

In an implementation, the pair of microstrips of the first odd-even mode circuit is short-circuited by using a short-circuit wire, and/or the pair of microstrips of the second odd-even mode circuit is short-circuited by using a short-circuit wire.

In an implementation, the pair of microstrips of the first odd-even mode circuit is symmetrical with respect to a middle line between the pair of microstrips and has a partially-widened part/partially-narrowed part, and/or the pair of microstrips of the second odd-even mode circuit is symmetrical with respect to a middle line between the pair of microstrips and has a partially-widened part/partially-narrowed part.

In an implementation, a capacitor and/or an inductor are/is disposed between the pair of microstrips of the first odd-even mode circuit, and/or a capacitor and/or an inductor are/is disposed between the pair of microstrips of the second odd-even mode circuit. All the foregoing several manners can implement adjustment of the admittance of the first odd-even mode circuit and the admittance of the second odd-even mode circuit, so that an implementation of the odd-even mode circuit is more flexible.

In an implementation, the first adjustable reactor includes a variable capacitance diode, and/or the second adjustable reactor includes a variable capacitance diode. Using a variable capacitance diode as an adjustable reactor can simplify design and manufacture of the power divider, and promote miniaturization of the power divider.

In an implementation, the power divider may further include an adjustment component. The adjustment component includes an adjustment port coupled to the first adjustable reactor and the second adjustable reactor to adjust the admittance of the first adjustable reactor and the admittance of the second adjustable reactor by adjusting values of voltages applied to the first adjustable reactor and the second adjustable reactor. The arrangement implements adjustment of the admittance of the first adjustable reactor and the admittance of the second adjustable reactor in a simple and efficient manner. In an implementation, the adjustment component may alternatively be another component independent of the power divider.

In an implementation, at least one of the first adjustable reactor and the second adjustable reactor includes a variable-length transmission line assembly. The power divider can be implemented in a cost-effective manner without affecting an existing circuit.

In an implementation, the variable-length transmission line assembly includes: a plurality of segments of transmission lines; and a plurality of switches that are connected in parallel and/or connected in series between the plurality of segments of transmission lines. In this implementation, the variable reactor can be implemented in a simple and efficient structure.

In an implementation, the power divider may further include an adjustment component. The adjustment component includes an adjustment port coupled to the first adjustable reactor and the second adjustable reactor to adjust the admittance of the first adjustable reactor and the admittance of the second adjustable reactor by adjusting states of the plurality of switches.

In an implementation, the transmission line includes a microstrip. This arrangement enables the variable reactor and even the entire power divider to be manufactured more easily.

A second aspect of this application provides an electronic device. The electronic device includes the power divider described in the foregoing first aspect and an antenna. A first radiating element and a second radiating element in a radiating element pair of the antenna are respectively coupled to the first output port and the second output port of the power divider. Excitation currents whose amplitude and phase are both adjustable are provided for an antenna pair of a wireless access point, so that a radiation pattern, polarization, a beam angle, and a beamwidth of the antenna pair are adjusted.

BRIEF DESCRIPTION OF DRAWINGS

The foregoing and other features, advantages, and aspects of embodiments of this application become more obvious with reference to the accompanying drawings and with reference to the following detailed descriptions. In the accompanying drawings, same or similar reference numerals represent same or similar elements.

DESCRIPTION OF EMBODIMENTS

Figure 1:
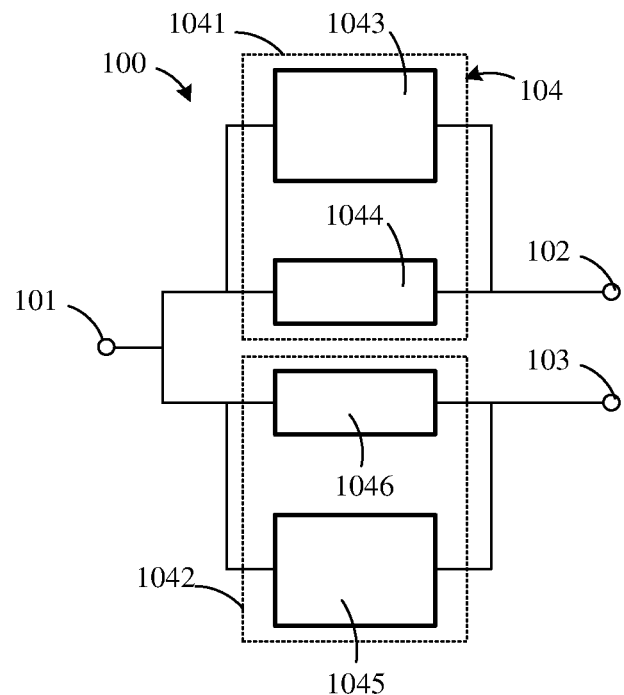
FIG. 1 is a conceptual diagram of a power divider according to an embodiment of this application.

The following describes embodiments of this application in detail with reference to the accompanying drawings. Although some embodiments of this application are shown in the accompanying drawings, it should be understood that this application may be implemented in various forms, and should not be construed as being limited to the embodiments described herein. On the contrary, these embodiments are provided so that this application will be thoroughly and completely understood. It should be understood that the accompanying drawings and embodiments of this application are merely used as examples, but are not intended to limit the protection scope of this application.

In descriptions of embodiments of this application, terms such as "first", "second", and the like may refer to different or same objects.

It should be understood that in this application, "coupling" may be understood as direct coupling and/or indirect coupling. Direct coupling may also be referred to as "electrical connection", and is understood as physical contact and electrical conduction of components. Direct coupling may also be understood as a form in which different components in a line structure are connected through physical lines that can transmit an electrical signal, such as a printed circuit board (printed circuit board, PCB) copper foil or a conducting wire. "Indirect coupling" may be understood as that two conductors are electrically conducted in a spaced/non-contact manner. In an embodiment, indirect coupling may also be referred to as capacitive coupling. For example, signal transmission is implemented by forming an equivalent capacitor through coupling in a gap between two spaced electric-conductors.

The following describes terms that may appear in embodiments of this application.

Connection: Two or more components are conducted or connected in the foregoing "electrical connection" or "indirect coupling" manner to perform signal/energy transmission, which may be referred to as connection.

Antenna pattern: The antenna pattern is also referred to as a radiation pattern. The antenna pattern refers to a pattern in which a relative field strength (a normalized modulus value) of an antenna radiation field changes with a direction at a specific distance from the antenna. The antenna pattern is usually represented by two plane patterns that are perpendicular to each other in a maximum radiation direction of an antenna.

The antenna pattern usually includes a plurality of radiation beams. A radiation beam with a highest radiation intensity is referred to as a main lobe, and the other radiation beams are referred to as side lobes. In the side lobes, a side lobe in an opposite direction of the main lobe is also referred to as a back lobe.

Beamwidth: The beamwidth includes a horizontal beamwidth and a vertical beamwidth. The horizontal beamwidth refers to an included angle between two directions that are on two sides of a direction of maximum radiation power in a horizontal direction and in which radiant power is 3 dB lower than the maximum radiation power. The vertical beamwidth refers to an included angle between two directions that are on two sides of a direction of maximum radiation power in the vertical direction and in which radiant power is 3 dB lower than the maximum radiation power.

Ground/ground plane: The ground/ground plane may usually refer to at least a part of any ground plane or any ground metal layer in an electronic device, or refer to at least a part of any combination of the foregoing ground layer, a ground plane, a ground component, or the like. The "ground/ground plane" may be used to ground a component in the electronic device. In an embodiment, the "ground/ground plane" may be a ground layer of a circuit board of an electronic device, or may be a ground metal layer formed by a ground plane formed using a middle frame of the electronic device or a metal thin film below a screen in the electronic device. In an embodiment, a circuit board may be a printed circuit board (printed circuit board, PCB). In an embodiment, a circuit board includes a dielectric substrate, a ground layer, and a wiring layer, and the wiring layer and the ground layer may be electrically connected through a via. In an embodiment, components such as a display, a touchscreen, an input button, a transmitter, a processor, a memory, a battery, a charging circuit, and a system on chip (system on chip, SoC) structure may be installed on or connected to a circuit board, or electrically connected to a wiring layer and/or a ground layer in the circuit board. For example, a radio frequency module is disposed on the wiring layer.

Any of the foregoing ground layers, or ground planes, or ground metal layers is made of conductive materials. In an embodiment, the conductive material may be any one of the following materials: copper, aluminum, stainless steel, brass and alloys thereof, copper foil on insulation laminates, aluminum foil on insulation laminates, gold foil on insulation laminates, silver-plated copper, silver-plated copper foil on insulation laminates, silver foil on insulation laminates and tin-plated copper, cloth impregnated with graphite powder, graphite-coated laminates, copper-plated laminates, brass-plated laminates and aluminum-plated laminates. A person skilled in the art may understand that the ground layer/ground plane/ground metal layer may alternatively be made of other conductive materials.

Transmission line: The transmission line refers to a connection line between a transceiver and a radiating element. A system that connects a radiating element of an antenna to a transceiver is referred to as a feed system. The feeder is further classified into a conducting-wire transmission line, a coaxial-line transmission line, a waveguide or a microstrip, and the like. At a transmitting end, a modulated high-frequency oscillation current (energy) generated by a transmitter is input to a transmit antenna through the feeder (the feeder can directly transmit current waves or electromagnetic waves based on different frequencies and forms). The transmit antenna converts the high-frequency current or a guided wave (energy) into a radio wave, that is, a free electromagnetic wave (energy), and radiates the electromagnetic wave to surrounding space. During reception, a radio wave (energy) is converted into a high-frequency current or a guided wave (energy) through a receive antenna and then transmitted to a receiver through the feeder. It can be learned from the foregoing process that an antenna is not only an apparatus that radiates and receives a radio wave, but also an energy converter, and is an interface component between a circuit and a space. A feed end or a feed point is an end or a vicinity of an end that is on a radiating element and that is connected to the feeder.

Impedance and impedance matching: An impedance of an antenna usually refers to a ratio of a voltage to a current at an input end of the antenna. The antenna impedance is a measure of resistance to an electrical signal in an antenna. In general, an input impedance of an antenna is a complex number. The real part is referred to as input resistance, which is represented by R; and the imaginary part is referred to as input reactance, which is represented by Xi. An antenna whose electrical length is far less than an operating wavelength has high input reactance. For example, a short dipole antenna has high capacitive reactance, and a smallring antenna has high inductive reactance. An input impedance of a half-wave dipole with a small diameter is approximately 73.1+i42.5 ohms. In an actual application, for ease of matching, it is generally expected that input reactance of a symmetrical dipole is zero. In this case, a length of the dipole is referred to as a resonance length. A length of a resonant half-wave dipole is slightly shorter than a half wavelength in free space, and in engineering, it is estimated that the length is 5% shorter than the half wavelength. The input impedance of an antenna is related to a geometric shape, a size, a feed point location, an operating wavelength, and surrounding environment of the antenna. When a diameter of a wire antenna is small, an input impedance changes smoothly with frequency, and an impedance bandwidth of the antenna is wide.

A main purpose of studying an antenna impedance is to realize matching between an antenna and a feeder. To match a transmit antenna with a feeder, an input impedance of an antenna should be equal to a characteristic impedance of the feeder. To match a receive antenna with a receiver, the input impedance of the antenna should be equal to a conjugate complex number of a load impedance. The receiver usually has an impedance of a real number. When the impedance of the antenna is a complex number, a matching network needs to be used to remove a reactance part of the antenna and make resistance parts of the antenna and the receiver equal.

When the antenna matches the feeder, power transmitted from the transmitter to the antenna or from the antenna to the receiver is the maximum. In this case, no reflected wave appears on the feeder, a reflection coefficient is 0, and a standing wave coefficient is 1. A matching degree of the antenna and the feeder is measured by a reflection coefficient or a standing wave ratio at an input end of the antenna. For the transmit antenna, if matching is poor, radiant power of the antenna decreases, loss on the feeder increases, and a power capacity of the feeder decreases. In serious cases, transmitter frequency "pulling" occurs, that is, an oscillation frequency changes.

Characteristic impedance: The characteristic impedance does not indicate direct-current resistance, and is a concept in long line transmission and indicates an impedance determined by a characteristic of a line. In a high-frequency range, for a location at which a signal arrives during signal transmission, a transient current is generated between a signal line and a reference plane (a power supply or a ground plane) due to establishment of an electric field. If a transmission line is isotropic, a current I always exists as long as a signal is transmitted. If an output level of the signal is V, the transmission line is equivalent to a resistance whose value is V/I during signal transmission. The equivalent resistance is referred to as a characteristic impedance Z of the transmission line. During the signal is transmitted, if the characteristic impedance on the transmission path changes, the signal is reflected at a node with a discontinuous impedance. A measurement unit of the characteristic impedance is ohm. A line impedance is determined by several factors: a line width, copper thickness, and dielectric layer thickness. Once a design of a PCB is completed, an impedance of each line is determined theoretically because the preceding factors have been determined. When a high frequency-band frequency is increased continuously, a characteristic impedance is asymptotically close to a fixed value. For example, a characteristic impedance of a coaxial cable is 50 ohms or 75 ohms, and a characteristic impedance of a twisted pair (for telephone and network communication) is 100 ohms (at a frequency higher than 1 MHz).

Admittance: the admittance is a general term for conductance and susceptance. In power electronics, an admittance is defined as the reciprocal of impedance, the symbol is Y, and the unit is Siemens, briefly referred to as S (S). Similar to an impedance, an admittance is also a complex number consists of a real number part (conductance G) and an imaginary number part (susceptance B): Y=G+iB. The admittance is a vector consists of two scalars: conductance and susceptance. The symbol of conductance is G. Conductance is used to describe ease with which a load charge passes through a conductor. That the charge passes easier indicates a conductance value is higher. The conductance value can be used for both an alternating current and a direct current. A symbol of susceptance is B. Susceptance is used to describe a ready state of an electronic assembly or an electronic circuit, or refer to a magnitude of energy released by a system when a voltage changes. A total admittance of admittances in a parallel circuit is equal to the sum of the admittances. A total admittance of admittances in a series circuit is equal to the reciprocal of the sum of reciprocals of the admittances.

Odd-even mode structure: The odd-even mode structure is also referred to as an odd-even mode circuit or a coupled microstrip consists of two microstrips that are placed in parallel and close to each other. The coupled microstrip has both asymmetric and symmetric structures. Two microstrips with a same size constitute a symmetrically-coupled microstrip, and two microstrips with different sizes constitute an asymmetrically-coupled microstrip.

Odd-mode coupling: Coupling with opposite propagation directions in two microstrips is referred to as odd-mode coupling, and a corresponding characteristic impedance is an odd-mode impedance. Even-mode coupling: Coupling with a same propagation direction in two microstrips is referred to as even-mode coupling, and a corresponding characteristic impedance is an even-mode impedance. Values of the two types of characteristic impedance are affected by a geometric size W/h of a coupled microstrip, where W is a line width of the strip, and h is thickness of a dielectric substrate on which the strip is located.

Inductor: When a conductor is energized, a magnetic field is generated in a specific space occupied by the conductor. Therefore, all conductors that can carry a current have general induction performance.

Variable capacitance diode: The variable capacitance diode is also referred to as a variable capacitance diode, is a low-power diode used for automatic frequency control and tuning. An electrostatic capacity of a PN junction of the variable capacitance diode is changed by applying a reverse voltage. Therefore, the variable capacitance diode is used for automatic frequency control, scanning oscillation, frequency modulation, and tuning. Generally, although a silicon diffused diode is used, a diode of special manufacturing such as an alloy diffused diode, an epitaxial bonded diode, or a double diffused diode may alternatively be used, because in terms of a voltage, a change rate of an electrostatic capacity of the foregoing diode is particularly large. Junction capacitance changes with a reverse voltage VR and replaces a variable capacitor to serve as a tuning loop, an oscillation circuit, and a phase-locked loop. The junction capacitance is usually used for channel conversion and a tuning circuit of a television low noise block and is usually made of silicon materials. Although a working principle of a variable capacitance diode for frequency multiplication is the same as a working principle of a variable capacitance diode used for automatic frequency control, a structure of the variable capacitance diode for frequency multiplication can withstand high power.

For the open end and the closed end mentioned in the foregoing embodiments, when being described, for example, relative to ground, the closed end is grounded, and the open end is not grounded; or when being described, for example, relative to another conductor, the closed end is electrically connected to the another conductor, and the open end is not electrically connected to the another conductor.

In addition, limitations mentioned in the foregoing content of this application that is related to a location and a distance, such as being in the middle or at a middle location, are all described in terms of a current process level, and are not absolutely-strict definitions in mathematics. For example, a middle location of a conductor refers to a midpoint of the conductor, and in actual application, it means that a junction between another component (for example, a feeder or a grounding stub) and the conductor covers the midpoint. A middle location of a slot or a middle location on a side of the slot refers to a midpoint of the side of the slot. In actual application, it means that a junction between another component (for example, a feeder) and the side covers the midpoint. In actual application, that a slit is provided in a middle location on one side of a slot means that a location on the side at which the slit is located covers a midpoint of the side.

The feed point mentioned in the foregoing content of this application may be any point in a connection area (which may also be referred to as a junction) of a feeder and a conductor, for example, a center point. A distance from a point (such as a feed point, a connection point, or a ground point) to a slot or from a slot to a point may refer to a distance from the point to a midpoint of the slot, or may refer to a distance from the point to two ends of the slot.

The technical solutions provided in this application are applicable to an electronic device using one or more of the following communications technologies: a Bluetooth (Bluetooth, BT) communications technology, a global positioning system (Global Positioning System, GPS) communications technology, a wireless local area network (WLAN) communications technology, a cellular network communications technology, and the like. The electronic device in embodiments of this application may include a device that directly connects a user front end to an operator network, including but not limited to base station equipment, a wireless access point, a telephone set, a wireless router, a firewall, a computer, an optical modem, a 4G-to-Wi-Fi wireless router, and the like. The electronic device in embodiments of this application may also include a mobile phone, a tablet computer, a notebook computer, a smart household, a smart band, a smartwatch, a smart helmet, smart glasses, and the like. Alternatively, the electronic device may be a handheld device or a computing device that has a wireless communication function, another processing device connected to a wireless modem, an in-vehicle device, or the like.

A power divider may also be used as a power combiner, and is usually applied to various microwave radio frequency systems such as a frequency mixer, a power amplification circuit, a large-scale multi-input multi-output (Multi-input Multi-output, MIMO) array antenna, and a phased array radar antenna. The power divider mainly implements signal power redistribution and recombination functions. With rapid development of modern communication systems and rapid change of integrated circuit manufacturing techniques, power dividers will develop towards smaller circuit sizes, more functions, higher reliability, and lower costs in the future.

At present, antennas are developed from simple antennas with unchangeable indicators toward reconfigurable antennas. A conventional antenna structure is fixed, and a beam pattern indicator of such antenna structure is unchangeable. As a capacity requirement of wireless communications is higher and new requirements such as anti-interference and induction measurement emerge, a previous invariable antenna cannot meet a scenario requirement. Therefore, there are demands for reconfigurable antennas with variable antenna specifications (such as beam patterns).

A main technical solution of a beam reconfigurable antenna is a dual-port antenna based on two working modes. Such type of antenna structure has a first mode (also referred to as a common mode) and a second mode (also referred to as a differential mode) that have different beam directions and beamwidths. When feeding currents with equal amplitudes and phases, two ports of such type of antenna work in a first mode; and when feeding currents with equal amplitudes and inverse phases, the two ports of such type of antenna work in a second mode. In the first mode, directions of induced currents on radiating elements of the antenna are the same; and in the second mode, directions of induced currents on the radiating elements of the antenna are reverse. In this way, an antenna with high isolation and different beam directions and beamwidths is provided.

In a feed network of a conventional antenna, there is an amplitude modulation variable power divider, used to separately provide two or more excitation current outputs to radiating elements. A principle of the amplitude modulation variable power divider is that a variable capacitive reactance and a variable inductive reactance are respectively connected in parallel on output paths of the power divider, so that impedance of two output branches is finally changed. Based on a principle of impedance voltage division, an amplitude of an output current on the output branch is changed. However, such variable power divider can only provide an output current (excitation current) with a variable amplitude, but cannot implement phase adjustment of the output current.

To resolve or at least partially resolve the foregoing or other potential problems in the power divider 100, an embodiment of this application provides a power divider 100. The power divider not only can adjust an amplitude of a current output from an output port, but also can adjust a phase of the output current, to implement at least arbitrary switching and adjustment between the first mode and the second mode of an antenna, and finally implement adjustment of a radiation pattern, a beam angle, and a beamwidth of the antenna.

FIG. 1 is a conceptual diagram of a power divider 100 according to an embodiment of this application. As shown in FIG. 1, in general, the power divider 100 according to this embodiment of this application includes a main port 101 used as an input port, two output ports, and an adjustment circuit coupled between the input port and the output ports. The main port 101 has a characteristic admittance. To be easily distinguished from another characteristic admittance in description, the characteristic admittance of the main port 101 is referred to as an input characteristic admittance. The two output ports are respectively a first output port 102 and a second output port 103. The first output port 102 has a first characteristic admittance. The second output port 103 has a second characteristic admittance. The first characteristic admittance and the second characteristic admittance may have a predetermined ratio relationship. Only when the input characteristic admittance is equal to the sum of the first characteristic admittance and the second characteristic admittance, the main port of the power divider can implement impedance matching. For example, in some embodiments, an appropriate transmission line is selected, so that the first characteristic admittance and the second characteristic admittance may be equal, that is, a ratio relationship between the first characteristic admittance and the second characteristic admittance is 1:1. The following mainly describes an inventive concept according to this application by using an example in which the two characteristic admittances are equal. It should be understood that a case of another ratio relationship of the two characteristic admittances is similar, and details are not separately described below.

The adjustment circuit includes a first adjustment branch 1041 coupled between the main port 101 and the first output port 102 and a second adjustment branch 1042 coupled between the main port 101 and the second output port 103. In the power divider 100 according to this embodiment of this application, admittances presented by the first adjustment branch 1041 and the second adjustment branch 1042 at the main port 101 are both adjustable, and a sum of the admittance presented by the first adjustment branch 1041 and the admittance presented by the second adjustment branch 1042 is equal to the input characteristic admittance. The admittance presented by the adjustment branch at the main port 101 refers to an admittance of an overall structure observed at the main port when each adjustment branch and an output port are considered as a whole. Being adjustable indicates that both of the admittances presented by the first adjustment branch 1041 and the second adjustment branch 1042 can be adjusted within a specific range. The input characteristic admittance is enabled to be equal to the sum of the first characteristic admittance and the second characteristic admittance, so that the main port 101 of the power divider 100 can implement impedance matching.

In this manner, impedance matching is implemented, and amplitudes and phases of currents at the first output port 102 and the second output port 103 can be adjusted by adjusting admittances of the first adjustable branch and the second adjustable branch. In this manner, the power divider 100 may be applied to any appropriate scenario to implement a required function. For example, in some embodiments, the power divider 100 may be configured to feed a radiating element pair of an antenna of a wireless access point. The first output port 102 and the second output port 103 of the power divider 100 are separately coupled to the radiating element pair to provide an excitation current whose amplitude and phase are adjustable to the radiating element pair, so that a radiation pattern, a beam angle, and a beamwidth of the antenna pair can be adjusted in real time.

Figure 2:
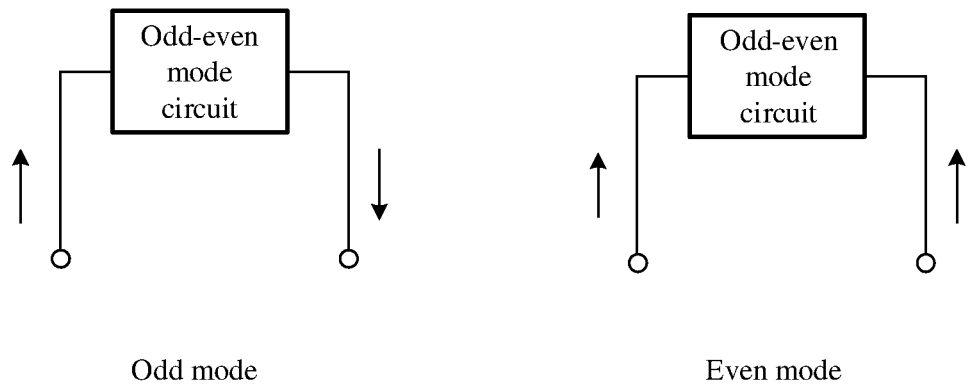
FIG. 2 is a schematic conceptual diagram of an odd-even mode circuit according to an embodiment of this application.
Figure 3:
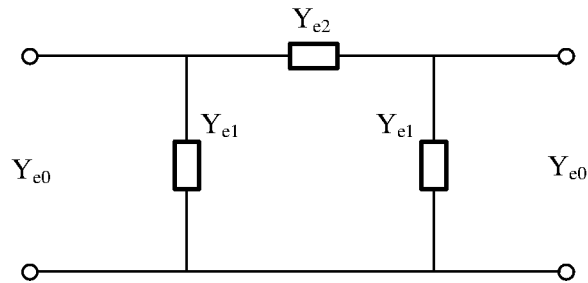
FIG. 3 is a schematic diagram of a π-shaped equivalent network for an odd-even mode circuit according to an embodiment of this application.

The following describes a principle according to this application with reference to different embodiments. In some embodiments, as shown in FIG. 1, the first adjustment branch 1041 may include a first odd-even mode circuit 1043 and a first adjustable reactor 1044. The first odd-even mode circuit 1043 and the first adjustable reactor 1044 are coupled in parallel between the main port 101 and the first output port 102. The first odd-even mode circuit 1043 has a first odd-mode admittance and a first even-mode admittance. In some embodiments, the second adjustment branch 1042 may include a second odd-even mode circuit 1045 and a second adjustable reactor 1046. The second odd-even mode circuit 1045 and the second adjustable reactor 1046 are coupled in parallel between the main port 101 and the second output port 103. The second odd-even mode circuit 1045 has a second odd-mode admittance and a second even-mode admittance. FIG. 2 shows a conceptual diagram of an odd-even mode circuit. When currents of two ports of the odd-even mode circuit flow reversely, the odd-even mode circuit is in an odd mode. In this case, the odd-even mode circuit has a first odd-mode admittance. When currents of the two ports flow in a same direction, the odd-even mode circuit is in an even mode. In this case, the odd-even mode circuit has a first even-mode admittance. FIG. 3 is a schematic diagram of a π-shaped equivalent network for an odd-even mode circuit. Based on FIG. 3 and according to definition of an odd-even mode circuit, it may be determined that an odd-mode admittance and an even-mode admittance of the odd-even mode mechanism shown in FIG. 3 are respectively as follows:

$$\begin{cases} Y_{e0}^{even} = Y_{e1} \\ Y_{e0}^{odd} = Y_{e1} + 2Y_{e2} \end{cases} \quad (1)$$

$Y_{e0}^{even}$ is the even-mode admittance of the odd-even mode circuit shown in FIG. 3, and $Y_{e0}^{odd}$ is the odd-mode admittance of the odd-even mode circuit shown in FIG. 3.

Figure 4:
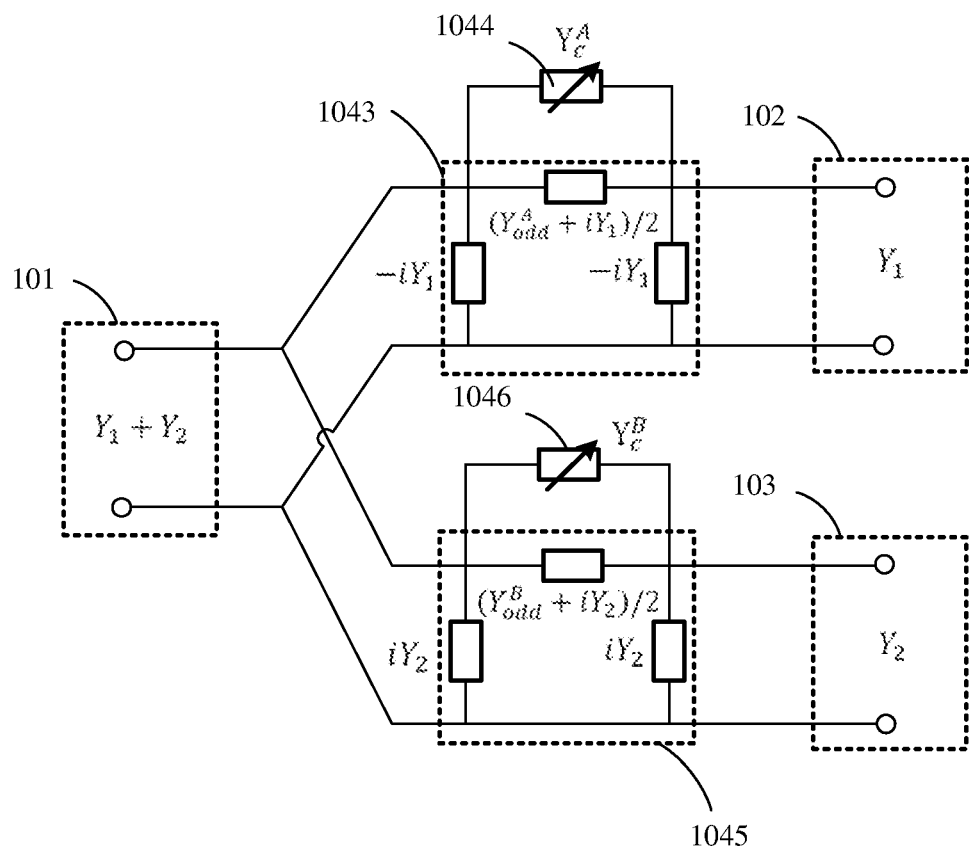
FIG. 4 is a general conceptual diagram of an output impedance of an adjustable reactor according to an embodiment of this application.

FIG. 4 is a general conceptual diagram of an output impedance of an adjustable reactor according to an embodiment of this application. As shown in FIG. 4, it may be determined, according to the definition of an odd-even mode circuit, that the first even-mode admittance of the first odd-even mode circuit 1043 and the second even-mode admittance of the second odd-even mode circuit 1045 are equal to:

$$\begin{cases} Y_{Even}^A = -iY_1 \\ Y_{Even}^B = iY_2 \end{cases} \quad (2)$$

$Y_{Even}^A$ is the first even-mode admittance, and $Y_{Even}^B$ is the second even-mode admittance.

Based on FIG. 4, it may be further determined, with reference to Equation (1), that the first odd-mode admittance of the first odd-even mode circuit 1043 is $Y_{odd}^A$, and the second odd-mode admittance of the second odd-even mode circuit 1045 is $Y_{odd}^B$. Therefore, with reference to FIG. 4, it may be determined that the admittances presented by the first adjustment branch 1041 and the second adjustment branch 1042 at the main port are respectively as follows:

$$\begin{cases} Y_A = \dfrac{(Y_1 - iY_1)\left(Y_c^A + \frac{1}{2}(Y_{odd}^A + iY_1)\right)}{Y_c^A + Y_1 + \frac{1}{2}(Y_{odd}^A - iY_1)} - iY_1 \\ Y_B = \dfrac{(Y_2 + iY_2)\left(Y_c^B + \frac{1}{2}(Y_{odd}^B - iY_2)\right)}{Y_c^B + Y_2 + \frac{1}{2}(Y_{odd}^B + iY_2)} + iY_2 \end{cases} \quad (3)$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively an admittance of the first adjustable reactor 1044 and an admittance of the second adjustable reactor 1046, and $Y_A$ and $Y_B$ are respectively the admittance presented by the first adjustment branch 1041 at the main port and the admittance presented by the second adjustment branch 1042 at the main port.

In this case, a total admittance $Y_{total}$ of the first adjustment branch 1041 and the second adjustment branch 1042 at the main port is $Y_{total}=Y_A+Y_B$.

To always ensure impedance matching of the power divider, the following condition needs to be met:

$$Y_{total}=Y_A+Y_B=Y_1+Y_2 \quad (4)$$

That is, the input characteristic admittance needs to be equal to the sum of the first characteristic admittance and the second characteristic admittance, and equal to the sum of the admittance presented by the first adjustment branch 1041 at the main port and the admittance presented by the second adjustment branch 1042 at the main port. Both the admittance of the first adjustable reactor 1044 in the first adjustment branch 1041 and the admittance of the second adjustable reactor 1046 in the second adjustment branch 1042 are adjustable, and a difference between the admittance of the first adjustable reactor 1044 and the admittance of the second adjustable reactor 1046 is a fixed value (the fixed value may be 0 or any other appropriate value). If Equation (3) is substituted into Equation (4), it may be determined that, to implement impedance matching of the power divider, the admittance of the first adjustable reactor 1044 and the admittance of the second adjustable reactor 1046 need to satisfy the following Equation (5):

$$\begin{cases} Y_c^A = -\dfrac{Y_1(2Y_c^B + Y_{odd}^B + Y_2(2+i))\left(\dfrac{iY_1 + Y_{odd}^A}{2} - \dfrac{Y_{odd}^A + Y_1(2-i)}{Y_1}\left(\dfrac{iY_1 + Y_2}{2} - \dfrac{Y_2(Y_c^B + \frac{Y_{odd}^B - iY_2}{2})}{2Y_c^B + Y_{odd}^B + Y_2(2+i)}\right)\right)}{Y_1 Y_2(3-i) + Y_1 Y_c^B(2-2i) + Y_2 Y_c^B(-2+2i) + Y_1 Y_{odd}^B(1-i) + Y_2 Y_{odd}^B(i-1) - Y_2^2(1+i)} \\ Y_c^B \in (-\infty i, \infty i) \end{cases} \quad (5)$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively the admittance of the first adjustable reactor 1044 and the admittance of the second adjustable reactor 1046.

That is, when the admittance of the first adjustable reactor 1044 and the admittance of the second adjustable reactor 1046 satisfy the foregoing Equation (5), $Y_{total}=Y_A+Y_B=Y_1+Y_2$. Therefore, the power divider always implements impedance matching. In this case, admittances of the first odd-even mode circuit 1043, the second odd-even mode circuit 1045, the first adjustable reactor 1044, and the second adjustable reactor 1046 satisfy the following relationship:

$$\begin{cases} Y_{Even}^A = -iY_1 \\ Y_{Even}^B = iY_2 \\ (Y_{odd}^A - Y_{odd}^B) + (Y_c^A - Y_c^B) = i(Y_1 + Y_2) \\ Y_c^A \in (-\infty i, \infty i) \\ Y_c^B \in (-\infty i, \infty i) \end{cases} \quad (6)$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively the admittance of the first adjustable reactor 1044 and the admittance of the second adjustable reactor 1046.

That is, when the admittance of the first odd-even mode circuit 1043, the admittance of the second odd-even mode circuit 1045, the admittance of the first adjustable reactor 1044, and the admittance of the second adjustable reactor 1046 satisfy the foregoing Equation (6), the power divider can implement matching of an input impedance and an output impedance.

At the same time, the admittance of the first adjustable reactor 1044 and the admittance of the second adjustable reactor 1046 can further be adjustable between positive infinity and negative infinity respectively. In this way, a ratio of amplitudes of currents output by the power divider can be arbitrarily adjustable between 0:1 and 1:1 and/or 1:1 to 1:0, and a difference between phases of the output currents can be arbitrarily adjustable from 0° to 180°. Corresponding reasons are further described below.

In some embodiments, the first characteristic admittance and the second characteristic admittance may be equal. In this case, the admittance presented by the first adjustment branch 1041 at the main port and the admittance presented by the second adjustment branch 1042 at the main port may be determined based on Equation (3) as follows:

$$\begin{cases} Y_A = \dfrac{(Y_0 - iY_0)\left(Y_c^A + \dfrac{1}{2}(Y_{odd}^A + iY_0)\right)}{Y_c^A + Y_0 + \dfrac{1}{2}(Y_{odd}^A - iY_0)} - iY_0 \\ Y_B = \dfrac{(Y_0 + iY_0)\left(Y_c^B + \dfrac{1}{2}(Y_{odd}^B - iY_0)\right)}{Y_c^B + Y_0 + \dfrac{1}{2}(Y_{odd}^B + iY_0)} + iY_0 \end{cases} \quad (7)$$

In this case, Equation (6) may be converted to the following equation:

$$\begin{cases} Y_{Even}^A = -iY_0 \\ Y_{Even}^B = iY_0 \\ (Y_{odd}^A - Y_{odd}^B) + (Y_c^A - Y_c^B) = 2iY_0 \\ Y_c^A \in (-\infty i, \infty i) \\ Y_c^B \in (-\infty i, \infty i) \end{cases} \quad (8)$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_0$ is the characteristic admittance of the first output port 102 and the characteristic admittance of the second output port 103 (when the characteristic admittance of the first output port 102 and the characteristic admittance of the second output port 103 are equal), and $Y_c^A$ and $Y_c^B$ are respectively the admittance of the first adjustable reactor 1044 and the admittance of the second adjustable reactor 1046.

That is, in some embodiments, the first even-mode admittance may be equal to a product of the first characteristic admittance and a negative unit imaginary number, and the second even-mode admittance is equal to a product of the second characteristic admittance and a positive unit imaginary number. In addition, a difference between the first odd-mode admittance and the second odd-mode admittance plus a difference between the admittance of the first adjustable reactor 1044 and the admittance of the second adjustable reactor 1046 is equal to a product of a sum of the first characteristic admittance and the second characteristic admittance, and a positive unit imaginary number. In this case, the total admittance at the main port is $K_{total}=Y_A+Y_B=2Y_0$. In this case, impedance matching of the power divider is always implemented. That is, as long as the admittance of the first odd-even mode circuit 1043, the admittance of the second odd-even mode circuit 1045, the admittance of the first adjustable reactor 1044, and the admittance of the second adjustable reactor 1046 satisfy Equation (8), the power divider always implements impedance matching.

For an adjustable reactor, in some embodiments, the first adjustable reactor 1044 and/or the second adjustable reactor 1046 may include variable capacitance diodes/a variable capacitance diode. Using a variable capacitance diode as an adjustable reactor can simplify design and manufacture of the power divider 100, and promote miniaturization of the power divider 100. In some embodiments, the admittance of the first adjustable reactor 1044 and the admittance of the second adjustable reactor 1046 may be adjusted by using an adjustment component. For example, the first adjustable reactor 1044 and the second adjustable reactor 1046 may be coupled to an adjustment port of the adjustment component. The adjustment component may adjust the admittance of the first adjustable reactor 1044 and the admittance of the second adjustable reactor 1046 by applying voltages on the first adjustable reactor 1044 and the second adjustable reactor 1046 through the adjustment port. For example, when the variable capacitance diodes used by the first adjustable reactor 1044 and the second adjustable reactor 1046 have a same specification, a same voltage is applied to the first adjustable reactor 1044 and the second adjustable reactor 1046, so that the admittance of the first adjustable reactor 1044 and the admittance of the second adjustable reactor 1046 can be equal.

Figure 5:
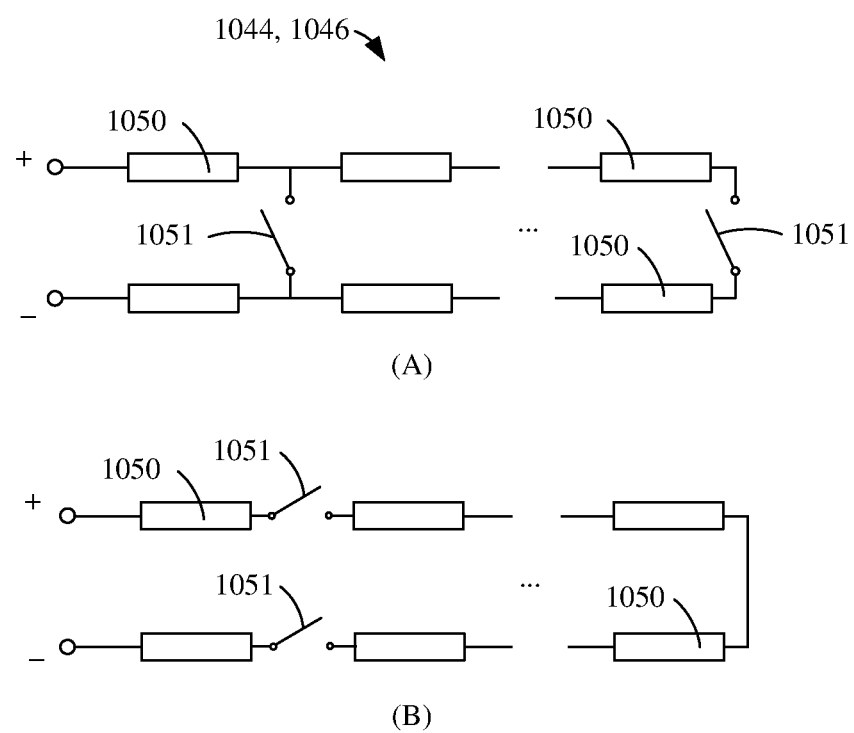
FIG. 5 shows a schematic diagram of an adjustable reactor implemented by using a variable-length transmission line assembly according to an embodiment of this application.

In some embodiments, as shown in FIG. 5, alternatively or additionally, the first adjustable reactor 1044 and/or the second adjustable reactor 1046 may alternatively be implemented by using a variable-length transmission line assembly. For example, in some embodiments, the variable-length transmission line assembly is short-circuited at an end and may include a plurality of segments of transmission lines 1050 formed by microstrips. A length of a transmission line 1050 of the first adjustable reactor 1044 may be the same as or different from a length of a transmission line of the second adjustable reactor 1046. In some embodiments, the plurality of segments of transmission lines 1050 may be implemented by using microstrips. A plurality of switches 1051 may be connected in parallel and/or in series between the plurality of segments of transmission lines 1050. When the length of the transmission line 1050 of the first adjustable reactor 1044 is different from the length of the transmission line of the second adjustable reactor 1046, the admittance of the first adjustable reactor 1044 and the admittance of the second adjustable reactor 1046 are not equal. How to adjust an admittance of the first adjustable reactor 1044 and an admittance of the second adjustable reactor 1046 is described below by using an example in which the length of the transmission line 1050 of the first adjustable reactor 1044 is the same as the length of the transmission line of the second adjustable reactor 1046.

(A) in FIG. 5 shows that the plurality of switches 1051 are connected in parallel between the plurality of segments of transmission lines 1050, and (B) in FIG. 5 shows that the plurality of switches 1051 are connected in series between the plurality of segments of transmission lines 1050. The adjustment component is used to control different quantities of switches 1051 to be opened and closed, so that a length of a transmission line can be changed by using the plurality of segments of transmission lines 1050. In this way, the admittance of the adjustable reactor is adjusted. In such an embodiment, accuracy of adjusting the admittance of the adjustable reactor is related to an admittance of each segment of transmission line 1050. In this manner, the power divider 100 can be implemented in a cost-effective manner without affecting an existing circuit. It should be understood that (A) in FIG. 5 shows a case in which the plurality of switches 1051 are connected in parallel between the plurality of segments of transmission lines 1050, and (B) in FIG. 5 shows a case in which the plurality of switches 1051 are connected in series between the plurality of segments of transmission lines 1050. It should be understood that this is merely an example, and is not intended to limit the protection scope of this application. The plurality of switches 1051 may alternatively be disposed between the plurality of transmission lines 1050 in a manner of being connected in series and in parallel. In addition, the switch 1051 may be implemented by using a diode or any appropriate component or structure. In some embodiments, an inventive concept according to this application is described by using an example in which the admittance of the first adjustable reactor 1044 and the admittance of the second adjustable reactor 1046 are adjusted to be equal in the foregoing manner (that is, a difference between the admittance of the first adjustable reactor 1044 and the admittance of the second adjustable reactor 1046 is fixed to 0). It should be understood that, in a case in which the difference between the admittance of the first adjustable reactor 1044 and the admittance of the second adjustable reactor 1046 is another fixed value, in addition to using the foregoing method for adjustment, a reactor (capacitor, inductor, or the like) with a predetermined value of reactance may alternatively be disposed in a corresponding adjustment circuit to provide the difference of the fixed value. This case is actually similar to a case in which the admittance of the first adjustable reactor 1044 and the admittance of the second adjustable reactor 1046 are equal. Details are not described separately below.

In an embodiment in which the admittance of the first adjustable reactor 1044 and the admittance of the second adjustable reactor 1046 are equal, based on the foregoing Equation (6) and Equation (8), admittances of the first odd-even mode circuit 1043, the second odd-even mode circuit 1045, the first adjustable reactor 1044, and the second adjustable reactor 1046 need to satisfy the following relationship to implement impedance matching of the power divider:

$$\begin{cases} Y_{odd}^A = Y_{Even}^B = iY_0 \\ Y_{Even}^A = Y_{odd}^B = -iY_0 \\ Y_c \in (-\infty i, \infty i) \end{cases} \quad (9)$$

$Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_0$ is a characteristic admittance of the first output port 102 and a characteristic admittance of the second output port 103 (when the characteristic admittance of the first output port 102 and the characteristic admittance of the second output port 103 are equal), and the admittance of the first adjustable reactor 1044 and the admittance of the second adjustable reactor 1046 are equal to $Y_c$.

That is, in some embodiments, a first characteristic admittance is equal to a second characteristic admittance, and the first odd-mode admittance is equal to the second even-mode admittance and is equal to a product of the first characteristic admittance and a positive unit imaginary number, and the first even-mode admittance is equal to the second odd-mode admittance and is equal to a product of the second characteristic admittance and a negative unit imaginary number. In this case, that is, in a case in which the admittance of the first odd-even mode circuit 1043, the admittance of the second odd-even mode circuit 1045, the admittance of the first adjustable reactor 1044, and the admittance of the second adjustable reactor 1046 satisfy the relationship of Equation (9), an input characteristic admittance $Y_{total}$ of the main port 101 of the power divider 100 is equal to the sum of the first characteristic admittance $Y_A$ and the second characteristic admittance $Y_B$. Based on Y1=Y2=Y0, $Y_C^A = Y_C^B = Y_c$, and Equation (3) and Equation (9), the following equation may be obtained:

$$Y_{total} = Y_A + Y_B = \left( \frac{(Y_0 - iY_0)\left(Y_C + \frac{1}{2}(Y_{odd}^A + iY_0)\right)}{Y_C + Y_0 + \frac{1}{2}(Y_{odd}^A - iY_0)} - iY_0 \right) + \quad (10)$$

$$\left( \frac{(Y_0 + iY_0)\left(Y_C + \frac{1}{2}(Y_{odd}^B - iY_0)\right)}{Y_C + Y_0 + \frac{1}{2}(Y_{odd}^B + iY_0)} + iY_0 \right) =$$

$$\left( \frac{(Y_0 - iY_0)\left(Y_C + \frac{1}{2}(iY_0 + iY_0)\right)}{Y_C + Y_0 + \frac{1}{2}(iY_0 - iY_0)} - iY_0 \right) +$$

$$\left( \frac{(Y_0 + iY_0)\left(Y_C + \frac{1}{2}(-iY_0 - iY_0)\right)}{Y_C + Y_0 + \frac{1}{2}(-iY_0 + iY_0)} - iY_0 \right) =$$

$$\frac{(Y_0 - iY_0)(Y_C + iY_0)}{Y_C + Y_0} + \frac{(Y_0 + iY_0)(Y_C - iY_0)}{Y_C + Y_0} = \frac{2Y_0Y_C + 2Y_0^2}{Y_C + Y_0} = 2Y_0$$

That is, as long as the admittance of the first odd-even mode circuit 1043 and the admittance of the second odd-even mode circuit 1045 satisfy Equation (9), the power divider 100 always implements impedance matching.

In this case, currents of the two output ports are as follows:

$$\begin{cases} I_2 = \frac{U_0(Y_0 - iY_0)(Y_c + iY_0)}{Y_0 + Y_c} \cdot \frac{Y_0}{Y_0 - iY_0} = \frac{Y_c + iY_0}{Y_0 + Y_c} U_0 Y_0 \\ I_3 = U_0 \frac{(Y_0 + iY_0)(Y_c - iY_0)}{Y_0 + Y_c} \cdot \frac{Y_0}{Y_0 + iY_0} = \frac{Y_c - iY_0}{Y_0 + Y_c} U_0 Y_0 \end{cases} \quad (11)$$

$I_2$ is a value of an output current of the first output port 102, $I_3$ is a value of an output current of the second output port 103, $Y_0$ is the characteristic admittance of the first output port 102 and the characteristic admittance of the second output port 103, $Y_c$ is the admittance of the first adjustable reactor 1044 and the admittance of the second adjustable reactor 1046, and $U_0$ is a voltage of the first output port 102 and the second output port 103.

It can be seen from Equation (11) that, when admittance values $Y_c$ of the first adjustable reactor 1044 and the second adjustable reactor 1046 are adjusted to enable the admittance values to change within a range $(-\infty i, \infty i)$, a ratio relationship between the output current of the first output port 102 and the output current of the second output port 103 of the power divider 100 is as follows:

$$\frac{I_2}{I_3} = \frac{Y_c + iY_0}{Y_c - iY_0} \quad (12)$$

$I_2$ is a value of the output current of the first output port 102, and $I_3$ is a value of the output current of the second output port 103.

Figure 6:
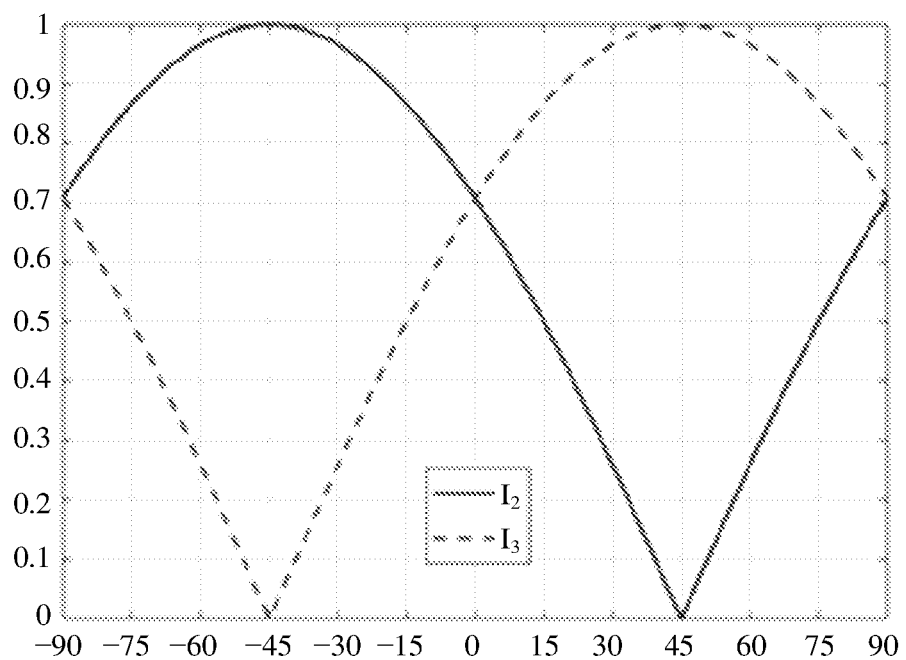
FIG. 6 is a schematic diagram of radiation and a phase of an output current of a power divider according to an embodiment of this application.
Figure 6:
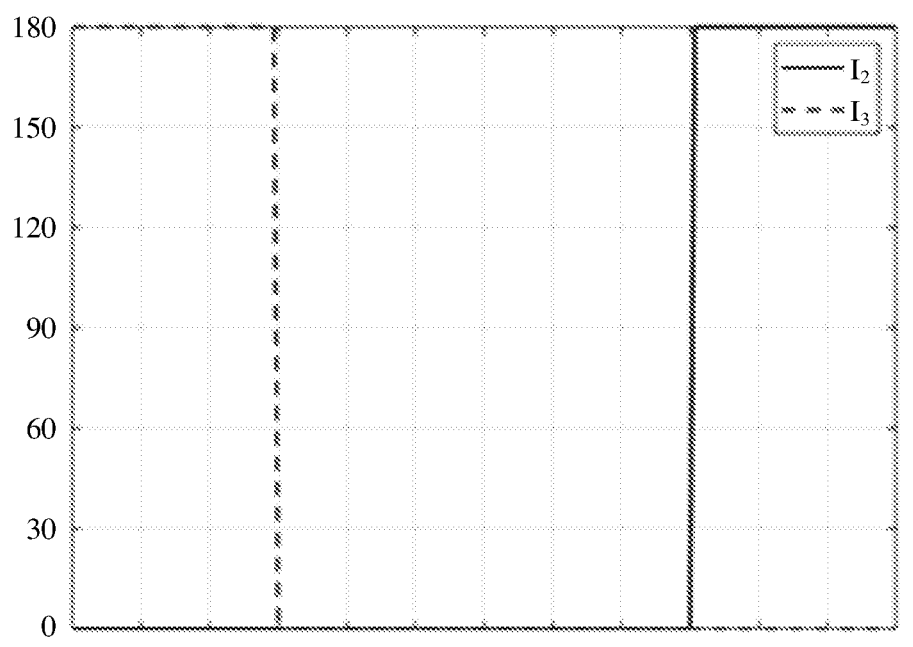

FIG. 6 is a schematic diagram in which amplitudes and phases of a first output current and a second output current change with the admittance values of the first adjustable reactor 1044 and the second adjustable reactor 1046 in this case. In FIG. 6, for ease of drawing, the admittance of the first adjustable reactor 1044 and the admittance of the second adjustable reactor 1046 satisfy $Y_c = iY_0 \tan\theta$. When $\theta \in (-90°, 90°)$, $Y_c \in (-\infty i, \infty i)$. In this case, a value range of $Y_c$ is consistent with the range assumed above. It can be learned from FIG. 6 that, when the admittance value of the adjustable reactor changes in an interval $(-\infty i, \infty i)$, amplitudes and phases of two paths of output currents of the power divider 100 change at the same time. The amplitudes of the two paths of currents change alternately, and the phases of the two paths of currents also switch alternately from an in-phase state to an inverse-phase state. This meets a requirement of common-differential mode variable feeding.

It can be learned that, in some embodiments, the admittance of the first adjustable reactor 1044 and the admittance of the second adjustable reactor 1046 can further be adjustable between positive infinity and negative infinity respectively. In this way, the ratio of the amplitudes of the currents output by the power divider can be arbitrarily adjustable between 0:1 and 1:1 and/or 1:1 to 1:0, and a difference between the phases of the output currents can be arbitrarily adjustable from 0° to 180°. Although that the ratio of the amplitudes of the currents output by the power divider can be arbitrarily adjustable between 0:1 and 1:1 and/or 1:1 to 1:0, and that a difference between the phases of the output currents can be arbitrarily adjustable from 0° to 180° are described based on the foregoing embodiment in which the first characteristic admittance and the second characteristic admittance are equal and the admittance of the first adjustable reactor 1044 and the admittance of the second adjustable reactor 1046 are equal. It should be understood that this is only shown schematically for the purpose of simplifying calculation and for ease of description. For an embodiment in which the first characteristic admittance and the second characteristic admittance are not equal and/or the admittance of the first adjustable reactor 1044 and the admittance of the second adjustable reactor 1046 are not equal, as long as the condition shown in Equation (6) is met, a ratio of the amplitudes of the currents output by the power divider can also be arbitrarily adjustable between 0:1 and 1:1 and/or 1:1 to 1:0, and a difference between the phases of the output currents can also be arbitrarily adjustable from 0° to 180°. A specific calculation process is not further described in detail in this specification.

Figure 7:
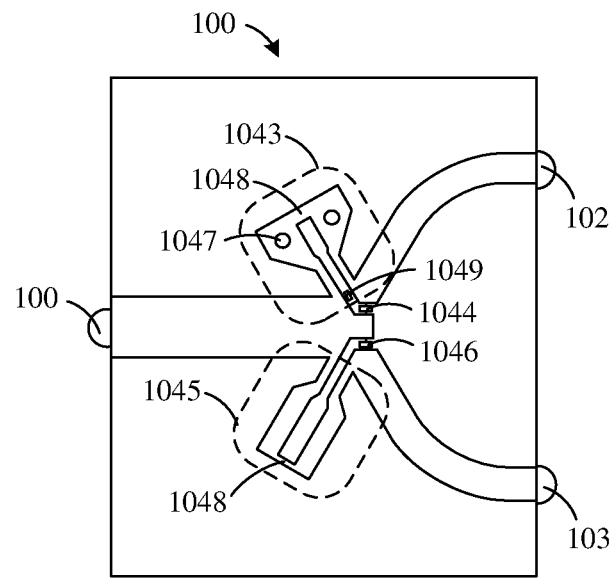
FIG. 7 is a simplified schematic diagram of a power divider according to an embodiment of this application.

FIG. 7 shows an example structure of a power divider 100 that can satisfy the foregoing equation relationship. Specifically, in some embodiments, the power divider 100 is arranged by using a microstrip. The microstrip is arranged on a circuit board. The circuit board may use a multi-layer structure. A microstrip structure that forms the power divider 100 is arranged at one layer of the circuit board, and ground is provided at a specific layer of the circuit board. In such an embodiment, a first odd-even mode circuit 1043 and a second odd-even mode circuit 1045 each include a pair of microstrips arranged at least partially in parallel. A concept according to this application is described by using an example below in which the power divider 100 is implemented by using a microstrip. It should be understood that any other appropriate circuit structure is possible as long as an admittance of the first odd-even mode circuit 1043, an admittance of the second odd-even mode circuit 1045, an admittance of the first adjustable reactor 1044, and an admittance of the second adjustable reactor 1046 can satisfy the relationship of the foregoing Equation (6), (8), or (9).

Figure 8:
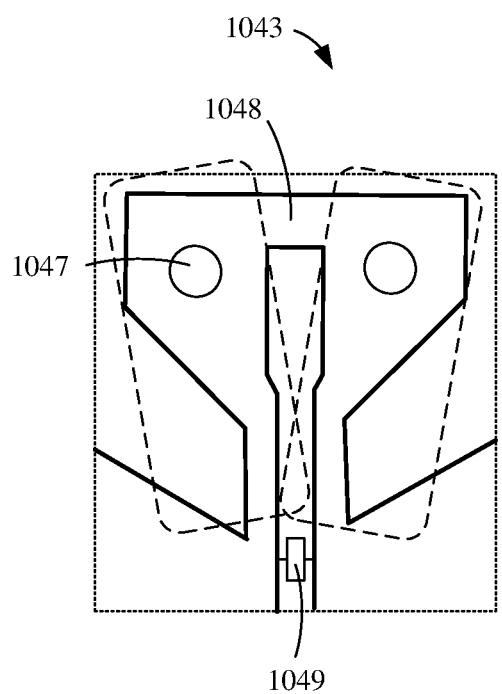
FIG. 8 is a simplified schematic diagram of a first odd-even mode circuit of a power divider according to an embodiment of this application.
Figure 9:
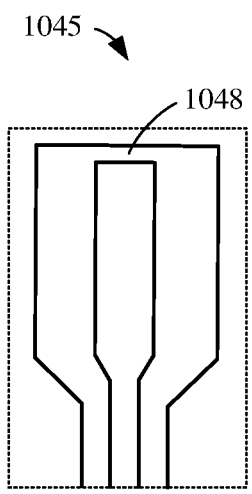
FIG. 9 is a simplified schematic diagram of a second odd-even mode circuit of a power divider according to an embodiment of this application.

An odd-mode admittance and an even-mode admittance of the first odd-even mode circuit 1043 and an odd-mode admittance and an even-mode admittance of the second odd-even mode circuit 1045 may be adjusted by using appropriate structures on the microstrip. These structures may include but are not limited to that the microstrip is grounded at a specific position (a ground point 1047), a pair of microstrips is short-circuited by using a short-circuit wire 1048 at a predetermined position, a partially-widened part, a partially-narrowed part, a capacitor and/or an inductor disposed between the pair of microstrips, and the like. FIG. 8 shows an example structure of a first odd-even mode circuit 1043, and FIG. 9 shows an example structure of a second odd-even mode circuit 1045. It can be seen from FIG. 8 and FIG. 9 that, in some embodiments, a pair of microstrips that forms the first odd-even mode circuit 1043 may be symmetrical with respect to a middle line, and the microstrip has a partially-widened part and a partially-narrowed part. The partially-widened part refers to a case in which a width of the microstrip is partially widened in an extension direction. Similarly, the partially-narrowed part refers to a case in which a width of the microstrip is partially narrowed in the extension direction. For example, assuming that a width of the microstrip that is not partially widened and that is not partially narrowed is a width corresponding to an impedance of 50 ohms, the width of the partially-widened part corresponds to a width corresponding to an impedance of 35 ohms, and the width of the partially-narrowed part corresponds to a width corresponding to an impedance of 70 ohms. A gradient part may be disposed between the partially-widened part and the partially-narrowed part to smooth transition. The first odd-even mode circuit 1043 may further be grounded at a ground point 1047. Grounding may be implemented by coupling the pair of microstrips to a ground layer at the ground point 1047 through a metal via hole. In addition, FIG. 8 further shows that the first odd-even mode circuit 1043 is short-circuited by using a short-circuit wire 1048 at a predetermined position (for example, an end of each microstrip in the pair of microstrips). The short-circuit wire 1048 and the pair of microstrips that forms the first odd-even mode circuit 1043 may be integrally formed. In addition, FIG. 8 further shows that a capacitor is disposed between the pair of microstrips that forms the first odd-even mode circuit 1043.

For the second odd-even mode circuit 1045, as shown in FIG. 9, a pair of microstrips of the second odd-even mode circuit 1045 may be short-circuited by using a short-circuit wire 1048 at an end. Similar to a structure of the first odd-even mode circuit 1043, the short-circuit wire 1048 and the pair of microstrips that forms the second odd-even mode circuit 1045 may also be integrally formed. Certainly, it should be understood that structures of the first odd-even mode circuit 1043 and the second odd-even mode circuit 1045 shown in FIG. 8 and FIG. 9 respectively are merely examples. Any other appropriate structure is also possible provided that admittance of the odd-even mode circuit meets the foregoing Equation (6), (8), or (9). Parameters of the pair of microstrips: that the microstrip is grounded at a ground point 1047, a pair of microstrips is short-circuited by using a short-circuit wire 1048 at a predetermined position, a partially-widened part, a partially-narrowed part, a capacitor and/or an inductor disposed between the pair of microstrips, and the like may be combined in any appropriate manner. For example, in some embodiments, a pair of microstrips of at least one of the first odd-even mode circuit 1043 and the second odd-even mode circuit 1045 may not be short-circuited or may be short-circuited in another position. For example, in some embodiments, the pair of microstrips may alternatively be short-circuited by using the short-circuit wire 1048 in the middle of each microstrip. In this case, only other parameters need to be adjusted so that the admittance of the first odd-even mode circuit 1043 and the admittance of the second odd-even mode circuit 1045 satisfy Equation (6), (8), or (9). For another example, in some embodiments, both the first odd-even mode circuit 1043 and the second odd-even mode circuit 1045 may be grounded at any appropriate ground point 1047 or neither of the first odd-even mode circuit 1043 and the second odd-even mode circuit 1045 is grounded.

Figure 10:
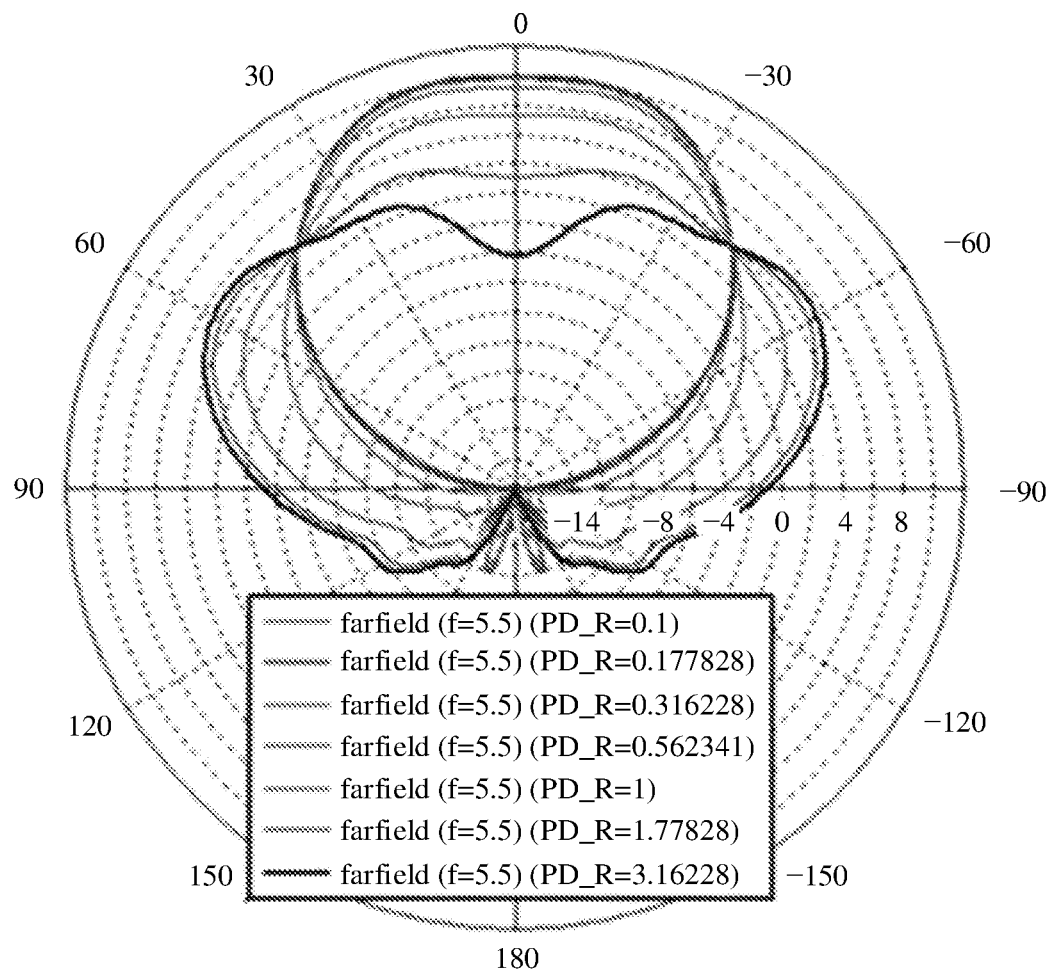
FIG. 10 shows a radiation pattern of an antenna used when a power divider feeds the antenna according to an embodiment of this application.

Another aspect according to this application further provides an electronic device. The electronic device may be a part of a feed network used for an antenna. The electronic device may include the power divider 100 described above and an antenna. The antenna includes a radiating element pair. A first radiating element and a second radiating element in the radiating element pair are coupled to the first output port 102 and the second output port 103 of the power divider 100 respectively. The power divider 100 may be configured to feed an antenna of a wireless access point. FIG. 10 shows a radiation pattern of an antenna used when the power divider 100 is used to feed the antenna. It can be learned from FIG. 10 that, excitation currents having adjustable amplitudes and phases are provided for an antenna pair of a wireless access point, so that a radiation pattern, a beam angle, and a beamwidth of the antenna pair are adjusted.

Although this application has been described in language specific to structural features and/or methodological acts, it should be understood that the subject matter defined in the appended claims is not necessarily limited to the specific features or acts described above. On the contrary, the specific features and acts described above are merely examples of implementing the claims.

What is claimed is:

1. A power divider, comprising:
    a main port having an input characteristic admittance;
    a first output port having a first characteristic admittance;
    a second output port having a second characteristic admittance, wherein the second characteristic admittance and the first characteristic admittance have a predetermined ratio relationship;
    a first adjustment branch, coupled between the main port and the first output port; and
    a second adjustment branch, coupled between the main port and the second output port, wherein the input characteristic admittance is a sum of an admittance presented by the first adjustment branch at the main port and an admittance presented by the second adjustment branch at the main port, wherein the admittance presented by the first adjustment branch at the main port and the admittance presented by the second adjustment branch at the main port are adjustable, and wherein the input characteristic admittance is enabled to be equal to a sum of the first characteristic admittance and the second characteristic admittance;
    wherein the first adjustment branch comprises a first odd-even mode circuit and a first adjustable reactor, and the first odd-even mode circuit has a first odd-mode admittance and a first even-mode admittance; and
    the second adjustment branch comprises a second odd-even mode circuit and a second adjustable reactor, and the second odd-even mode circuit has a second odd-mode admittance and a second even-mode admittance.

2. The power divider according to claim 1, wherein:
    an admittance of the first adjustable reactor and an admittance of the second adjustable reactor are adjustable, and a difference between the admittance of the first adjustable reactor and the admittance of the second adjustable reactor is a fixed value.

3. The power divider according to claim 2, wherein the first odd-even mode circuit and the first adjustable reactor are coupled in parallel between the main port and the first output port, and
    wherein the second odd-even mode circuit and the second adjustable reactor are coupled in parallel between the main port and the second output port.

4. The power divider according to claim 2, wherein admittances of the first odd-even mode circuit, the second odd-even mode circuit, the first adjustable reactor, and the second adjustable reactor satisfy the following relationship:

$$\begin{cases} Y_{Even}^A = -iY_1 \\ Y_{Even}^B = iY_2 \\ (Y_{odd}^A - Y_{odd}^B) + (Y_c^A - Y_c^B) = i(Y_1 + Y_2), \\ Y_c^A \in (-\infty i, \infty i) \\ Y_c^B \in (-\infty i, \infty i) \end{cases}$$

wherein $Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively the admittance of the first adjustable reactor and the admittance of the second adjustable reactor.

5. The power divider according to claim 1, wherein the first odd-even mode circuit and the second odd-even mode circuit each comprise a pair of microstrips arranged in parallel.

6. The power divider according to claim 5, wherein at least one of:
    the pair of microstrips of the first odd-even mode circuit are grounded; or
    the pair of microstrips of the second odd-even mode circuit are grounded.

7. The power divider according to claim 5, wherein at least one of:
    the pair of microstrips of the first odd-even mode circuit are short-circuited with a short-circuit wire; or
    the pair of microstrips of the second odd-even mode circuit are short-circuited with a short-circuit wire.

8. The power divider according to claim 2, wherein at least one of:
    the first adjustable reactor comprises a variable capacitance diode; or
    the second adjustable reactor comprises a variable capacitance diode.

9. The power divider according to claim 8, further comprising:
    an adjustment component, comprising an adjustment port coupled to the first adjustable reactor and the second adjustable reactor to adjust the admittance of the first adjustable reactor and the admittance of the second adjustable reactor by adjusting values of voltages applied to the first adjustable reactor and the second adjustable reactor.

10. The power divider according to claim 2, wherein at least one of the first adjustable reactor and the second adjustable reactor comprises a variable-length transmission line assembly.

11. The power divider according to claim 10, wherein the variable-length transmission line assembly comprises:

a plurality of segments of transmission lines; and
a plurality of switches, connected in parallel or connected in series between the plurality of segments of transmission lines.

12. The power divider according to claim 11, further comprising:
an adjustment component, comprising an adjustment port coupled to the first adjustable reactor and the second adjustable reactor to adjust the admittance of the first adjustable reactor and the admittance of the second adjustable reactor by adjusting states of the plurality of switches.

13. The power divider according to claim 11, wherein the transmission line comprises a microstrip.

14. An electronic device, comprising:
a power divider comprising:
a main port having an input characteristic admittance;
a first output port having a first characteristic admittance;
a second output port having a second characteristic admittance, wherein the second characteristic admittance and the first characteristic admittance have a predetermined ratio relationship;
a first adjustment branch, coupled between the main port and the first output port; and
a second adjustment branch, coupled between the main port and the second output port, wherein the input characteristic admittance is a sum of an admittance presented by the first adjustment branch at the main port and an admittance presented by the second adjustment branch at the main port, wherein the admittance presented by the first adjustment branch at the main port and the admittance presented by the second adjustment branch at the main port are adjustable, and wherein the input characteristic admittance is enabled to be equal to a sum of the first characteristic admittance and the second characteristic admittance;
wherein the first adjustment branch comprises a first odd-even mode circuit and a first adjustable reactor, and the first odd-even mode circuit has a first odd-mode admittance and a first even-mode admittance; and
the second adjustment branch comprises a second odd-even mode circuit and a second adjustable reactor, and the second odd-even mode circuit has a second odd-mode admittance and a second even-mode admittance; and
an antenna, wherein a first radiating element and a second radiating element in a radiating element pair of the antenna are coupled to the first output port and the second output port of the power divider respectively.

15. The electronic device according to claim 14, wherein:
an admittance of the first adjustable reactor and an admittance of the second adjustable reactor are adjustable, and a difference between the admittance of the first adjustable reactor and the admittance of the second adjustable reactor is a fixed value.

16. The electronic device according to claim 15, wherein the first odd-even mode circuit and the first adjustable reactor are coupled in parallel between the main port and the first output port, and
wherein the second odd-even mode circuit and the second adjustable reactor are coupled in parallel between the main port and the second output port.

17. The electronic device according to claim 15, wherein admittances of the first odd-even mode circuit, the second odd-even mode circuit, the first adjustable reactor, and the second adjustable reactor satisfy the following relationship:

$$\begin{cases} Y_{Even}^A = -iY_1 \\ Y_{Even}^B = iY_2 \\ (Y_{odd}^A - Y_{odd}^B) + (Y_c^A - Y_c^B) = i(Y_1 + Y_2), \\ Y_c^A \in (-\infty i, \infty i) \\ Y_c^B \in (-\infty i, \infty i) \end{cases}$$

wherein $Y_{odd}^A$ is the first odd-mode admittance, $Y_{Even}^B$ is the second even-mode admittance, $Y_{Even}^A$ is the first even-mode admittance, $Y_{odd}^B$ is the second odd-mode admittance, $Y_1$ is the first characteristic admittance, $Y_2$ is the second characteristic admittance, and $Y_c^A$ and $Y_c^B$ are respectively the admittance of the first adjustable reactor and the admittance of the second adjustable reactor.

18. The electronic device according to claim 14, wherein the first odd-even mode circuit and the second odd-even mode circuit each comprise a pair of microstrips arranged in parallel.

19. The electronic device according to claim 18, wherein at least one of:
the pair of microstrips of the first odd-even mode circuit are grounded; or
the pair of microstrips of the second odd-even mode circuit are grounded.

20. The electronic device according to claim 18, wherein at least one of:
the pair of microstrips of the first odd-even mode circuit are short-circuited with a short-circuit wire; or
the pair of microstrips of the second odd-even mode circuit are short-circuited with a short-circuit wire.

* * * * *